United States Patent
Ueno et al.

(10) Patent No.: US 10,414,017 B2
(45) Date of Patent: Sep. 17, 2019

(54) POLISHING APPARATUS

(71) Applicants: SHIN-ETSU HANDOTAI CO., LTD., Tokyo (JP); FUJIKOSHI MACHINERY CORP., Nagano-shi, Nagano (JP)

(72) Inventors: Junichi Ueno, Shirakawa (JP); Michito Sato, Nishigo-mura (JP); Kaoru Ishii, Shirakawa (JP); Hiromi Kishida, Chikuma (JP); Yosuke Kanai, Nagano (JP); Yuya Nakanishi, Nagano (JP)

(73) Assignees: SHIN-ETSU HANDOTAI CO., LTD., Tokyo (JP); FUJIKOSHI MACHINERY CORP., Nagano-shi (JP)

( * ) Notice: Subject to any disclaimer, the term of this patent is extended or adjusted under 35 U.S.C. 154(b) by 0 days.

(21) Appl. No.: 15/512,939

(22) PCT Filed: Sep. 24, 2015

(86) PCT No.: PCT/JP2015/004842
§ 371 (c)(1),
(2) Date: Mar. 21, 2017

(87) PCT Pub. No.: WO2016/067518
PCT Pub. Date: May 6, 2016

(65) Prior Publication Data
US 2017/0304986 A1    Oct. 26, 2017

(30) Foreign Application Priority Data
Oct. 30, 2014 (JP) ................................ 2014-221600

(51) Int. Cl.
B24B 37/005    (2012.01)
B24B 49/12    (2006.01)
(Continued)

(52) U.S. Cl.
CPC .......... *B24B 37/0053* (2013.01); *B24B 37/10* (2013.01); *B24B 37/34* (2013.01); *B24B 49/12* (2013.01); *H01L 21/304* (2013.01)

(58) Field of Classification Search
CPC ...... B24B 37/10; B24B 37/0053; B24B 49/12
(Continued)

(56) References Cited

U.S. PATENT DOCUMENTS 5,647,789 A     7/1997 Kitta et al.
5,733,171 A *   3/1998 Allen .................. B24B 37/0053
                                                    451/41
(Continued)

FOREIGN PATENT DOCUMENTS

CN    103959446 A    7/2014
JP    H07-130687 A   5/1995
(Continued)

OTHER PUBLICATIONS

Oct. 17, 2017 Office Action issued in Taiwanese Patent Application No. 104134404.
(Continued)

Primary Examiner — Robert A Rose
(74) Attorney, Agent, or Firm — Oliff PLC

(57) ABSTRACT

A polishing apparatus includes: a plurality of polishing heads for holding a wafer, a polishing pad for polishing the wafer, a rotatable turn table having the polishing pad attached thereto, a turn table driving mechanism for rotating the turn table, a plurality of wafer-detecting sensors for detecting coming off of the wafer from the polishing head during polishing, wherein the polishing apparatus has the wafer-detecting sensor disposed above peripheral portions of the respective polishing heads and on each downstream side in a rotation direction of the turn table with respect to the respective polishing heads. The polishing apparatus can
(Continued)

detect coming off of a wafer from a polishing head during polishing more rapidly, and can prevent a breakage of the wafer thereby.

2 Claims, 6 Drawing Sheets

(51) Int. Cl.
*B24B 37/34* (2012.01)
*H01L 21/304* (2006.01)
*B24B 37/10* (2012.01)

(58) Field of Classification Search
USPC .................. 451/5, 6, 8–11, 287–290, 41
See application file for complete search history.

(56) References Cited

U.S. PATENT DOCUMENTS

| | | | |
|---|---|---|---|
| 5,934,979 A * | 8/1999 | Talieh | B24B 21/004 451/271 |
| 6,045,434 A * | 4/2000 | Fisher, Jr. | B24B 37/005 451/10 |
| 6,250,997 B1 | 6/2001 | Hatano et al. | |
| 6,293,846 B1 * | 9/2001 | Oguri | B24B 37/0053 257/E21.001 |
| 6,634,924 B1 * | 10/2003 | Ono | B24B 37/0053 451/287 |
| 2003/0186624 A1 | 10/2003 | Koike et al. | |
| 2013/0122782 A1 | 5/2013 | Chang et al. | |
| 2013/0122788 A1 * | 5/2013 | Chang | B24B 49/16 451/59 |

FOREIGN PATENT DOCUMENTS

| | | |
|---|---|---|
| JP | H08-247721 A | 9/1996 |
| JP | 2000-127033 A | 5/2000 |
| JP | 2001-133217 A | 5/2001 |
| JP | 2003-059876 A | 2/2003 |
| JP | 2006-011434 A | 1/2006 |
| JP | 2008-093811 A | 4/2008 |

OTHER PUBLICATIONS

May 2, 2017 International Preliminary Report on Patentability issued with International Patent Application No. PCT/JP2015/004842.
Nov. 10, 2015 International Search Report issued in International Patent Application No. PCT/JP2015/004842.
Mar. 4, 2019 Office Action issued in Chinese Patent Application No. 201580059114.6.
Jul. 16, 2018 Office Action issued in Chinese Patent Application No. 201580059114.6.

\* cited by examiner

POLISHING APPARATUS

TECHNICAL FIELD

The present invention relates to a polishing apparatus, particularly to a polishing apparatus provided with wafer-detecting sensors.

BACKGROUND ART

Single side polishing of a wafer is performed by using a polishing apparatus composed of a turn table having a polishing pad attached thereto, a polishing agent supply mechanism for supplying a polishing agent onto the polishing pad, a polishing head for holding a wafer, etc. These apparatus polish a wafer by holding the wafer with the polishing head, supplying the polishing agent onto the polishing pad from the polishing agent supply mechanism, and bringing the surface of the wafer into sliding contact with the polishing pad while rotating each of the turn table and the polishing head (see Patent Document 1, for example).

In polishing a wafer with a polishing apparatus described above, the wafer sometimes comes off from the polishing head. In some cases, the polished wafer is left on the turn table due to a mistake in picking up. In order to detect these, polishing apparatuses are provided with a wafer-detecting sensor(s).

The wafer-detecting sensor is provided with functions to stop the polishing apparatus and to raise an alarm to let an operator know an accident when detecting coming off of a wafer from the polishing head during polishing in order to prevent a detached wafer from being in contact with another polishing head and broken, and to prevent continuing the polishing with the wafer being broken.

The wafer-detecting sensors have been disposed at two places between the adjacent polishing heads 102 on the turn table 104 as shown in FIG. 9 and FIG. 10. As the wafer-detecting sensors 106, a general optical fiber type, which take 500 μs to output a stop signal from detecting a wafer, have been used.

As the turn table driving mechanism for rotating the turn table 104 used in the previous polishing apparatus 101, a warm speed reducer 111 and a constant torque motor 112 for inverter driving shown in FIG. 11 have been used. The rotation of the constant torque motor 112 for inverter driving is transmitted to the speed reducer 111 via a pulley and a timing belt.

When the wafer-detecting sensor cannot detect a wafer that has come off from the polishing head 102, the wafer can collide to another polishing head on the same turn table and be broken. In a method to perform polishing by way of plural turn tables, called an index system, fine pieces of the broken wafer adhered on a polishing head can bring secondary contamination of an ordinal polishing pad 103 since the polishing head moves to another turn table to continue polishing.

When a wafer is broken during polishing, fine pieces of the wafer left on the polishing pad 103 can generate a scratch on the polishing pad 103. Accordingly, the polishing pad 103 is subjected to cleaning or exchanging. The polishing head 102 is also exchanged since the polishing head 102 cannot be used due to the broken wafer left on the absorption surface of the polishing head 102 and a retainer guide. In a polishing system to use a polishing agent while recycling thereof, the polishing agent has to be cleaned in order to remove the fine pieces of a wafer penetrated in a circular line of the polishing agent. As described above, when a wafer is broken during polishing, the polishing is suspended for a long time to restore the polishing apparatus, which lowers the productivity.

When a wafer comes off from the polishing head 102, the wafer-detecting sensors 106 detects the wafer by light reflection, and suddenly stops the rotation of the motor 112 of the turn table driving mechanism. However, in an apparatus with the turn table driving mechanism having a power transmittance part by mechanical contact such as a speed reducer as described above, an immediate stop is actually impossible since it causes a damage of the apparatus such as a breakage of a gear, tooth skipping and wearing of a belt in the speed reducer. Moreover, the motor does not have a function which can forcibly stop itself, thereby continuing the rotation with an inertia in proportion to the weight of the turn table 104. In this case, the rotation of the turn table 104 has been stopped by pressure of the polishing heads 102 to press the turn table 104.

In the previous polishing apparatus described above, collision of a wafer can be avoided when the rotation rate of the turn table is low, with procedures of detecting coming off of the wafer from the polishing head during polishing with the wafer-detecting sensor and then stopping the turn table. When the rotation rate of the turn table is high or middle, however, the turn table cannot be stopped, thereby causing collision of a wafer if the wafer-detecting sensor detects coming off of the wafer from the polishing head during polishing and begins to stop the turn table.

CITATION LIST

Patent Literature

Patent Document 1: Japanese Unexamined Patent publication (Kokai) No. 2008-93811

SUMMARY OF INVENTION

Technical Problem

The present invention was accomplished in view of the above-described problems. It is an object of the present invention to provide a polishing apparatus which can detect coming off of a wafer from a polishing head during polishing more rapidly, and can prevent a breakage of the wafer thereby.

Solution to Problem

To solve the problems, the present invention provides a polishing apparatus comprising:
a plurality of polishing heads for holding a wafer,
a polishing pad for polishing the wafer,
a rotatable turn table having the polishing pad attached thereto,
a turn table driving mechanism for rotating the turn table,
a plurality of wafer-detecting sensors for detecting coming off of the wafer from the polishing head during polishing,
wherein each of the plurality of wafer-detecting sensors is disposed above peripheral portions of the respective polishing heads and on downstream side in a rotation direction of the turn table with respect to the respective polishing heads.

Such an apparatus can detect coming off of a wafer from the polishing head more rapidly. As a result, it is possible to prevent the wafer detached from the polishing head from colliding with another polishing head, and to prevent a breakage of the wafer thereby.

It is preferable that the polishing apparatus further comprising a plurality of wafer-detecting sensors each disposed above peripheral portions of the respective polishing heads and on upstream side in a rotation direction of the turn table with respect to the respective polishing heads.

Such an apparatus can detect coming off of a wafer from the polishing head during polishing more rapidly even when the wafer is polished with the turn table being rotated reversely to the foregoing rotation. As a result, it is possible to prevent the wafer detached from the polishing head from colliding with another polishing head.

It is preferable that each of the plurality of wafer-detecting sensors takes 80 μs or less to output a detection signal from detecting the wafer.

Such an apparatus takes shorter time to output the detection signal from detecting the wafer, thereby making it possible to prevent the wafer detached from the polishing head from colliding with another polishing head more securely.

It is preferable that the turn table driving mechanism rotate the turn table directly by a motor without using a speed reducer and has a function of forcibly stopping a rotation of the motor.

Such an apparatus takes shorter time to stop the rotation of the turn table, thereby making it possible to prevent the wafer detached from the polishing head from colliding with another polishing head more securely.

Advantageous Effects of Invention

The inventive polishing apparatus can detect coming off of a wafer from the polishing head during polishing more rapidly than the previous ones. As a result, it is possible to prevent the wafer detached from the polishing head from colliding with another polishing head, and to prevent a breakage of the wafer thereby.

DESCRIPTION OF EMBODIMENTS

Hereinafter, embodiments of the present invention will be described, but the present invention is not limited thereto.

As described above, it has been a problem of wafer polishing in which a wafer comes off from a polishing head and collides to another polishing head, generating a breakage of the wafer, thereby lowering the productivity.

Accordingly, the inventors have diligently investigated to solve such a problem. As a result, the inventors have conceived to dispose wafer-detecting sensors above peripheral portions of the respective polishing heads and dispose on each downstream side in a rotation direction of the turn table with respect to the respective polishing heads, and investigated on the best mode to accomplish these to complete the present invention.

Figure 1:
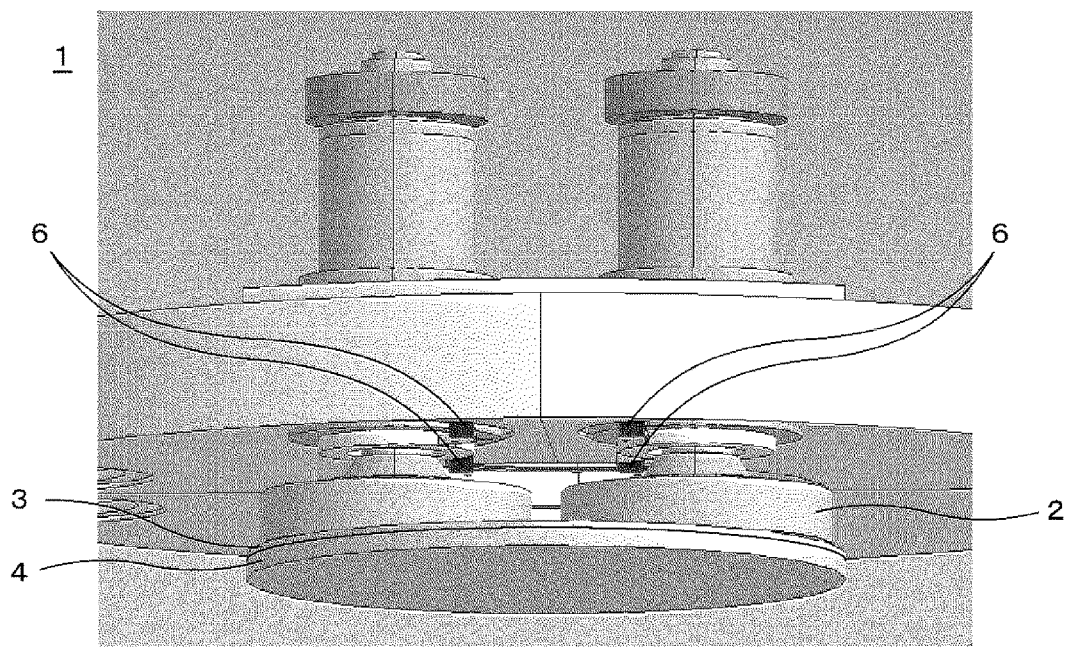
FIG. 1 is a schematic diagram showing an example of the inventive polishing apparatus.

As shown in FIG. 1, the inventive polishing apparatus 1 is provided with a plurality of polishing heads 2 for holding a wafer, a polishing pad 3 for polishing the wafer, a rotatable turn table 4 having the polishing pad 3 attached thereto, a turn table driving mechanism 5 for rotating the turn table 4 (see FIG. 2), and a plurality of wafer-detecting sensors 6 for detecting coming off of the wafer from the polishing head 2 during polishing.

The following illustration relates to a case in which two polishing heads are allocated to one turn table such as the polishing apparatus 1 shown in FIG. 1, but the present invention is not limited thereto. In such a polishing apparatus 1, two wafers can be polished simultaneously by one turn table.

As shown in FIG. 1, the two polishing heads 2 are disposed above the turn table 4. The polishing head 2 can hold a wafer in any method. For example, a vacuum suction method and a water paste method with a template can be used.

Figure 2:
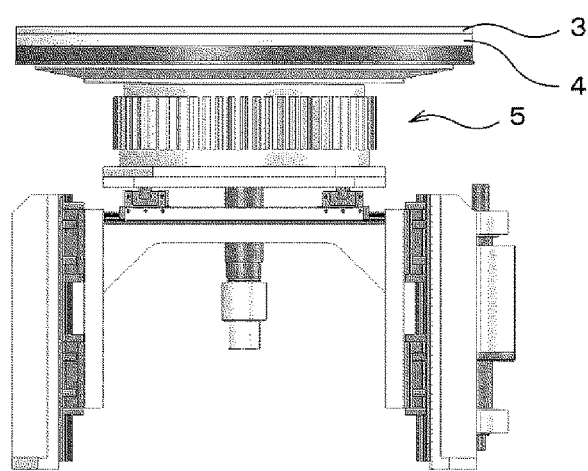
FIG. 2 is a schematic diagram showing an example of the turn table driving mechanism in the inventive polishing apparatus.

As shown in FIG. 2, the turn table driving mechanism 5 is disposed under the turn table 4. While rotating the turn table with the turn table driving mechanism 5, and supplying a polishing agent onto the turn table 4 from a polishing agent supply mechanism (not shown), the polishing head 2 holding a wafer is rotated, and the wafer is brought into sliding contact with the polishing pad 3, thereby polishing the wafer.

When the wafer come off from the polishing head 2, the wafer travels toward the rotation direction of the turn table 4 together with the turn table 4 in the wake of rotation of the turn table 4, which increases the amount of coming off of the wafer from the polishing head. The wafer-detecting sensors 6 are intended to detect such a wafer that has come off. The wafer-detecting sensor 6 can also detect a wafer left by a mistake for picking up the polished wafer.

The wafer-detecting sensor 6, when it detects coming off of a wafer from the polishing head 2 during polishing, outputs a detection signal (forcibly stopping signal) to the turn table driving mechanism 5 to stop the rotation of the turn table 4. This makes it possible to prevent the detached wafer from being in contact with another polishing head 2 and broken, and to prevent continuing the polishing with the wafer being broken. The wafer-detecting sensor 6 can have a function to stop the polishing apparatus and to raise an alarm to let an operator know an accident.

Figure 3:
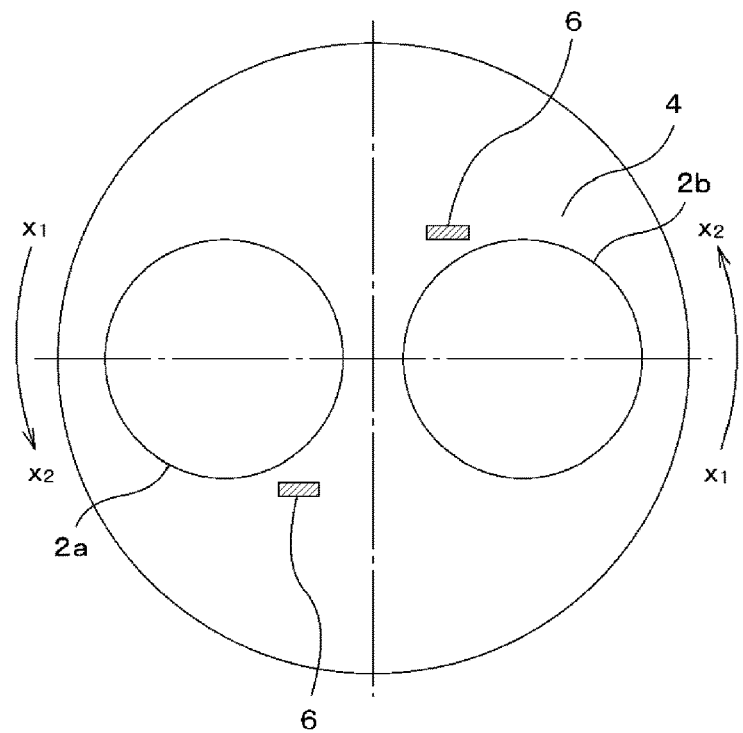
FIG. 3 is a schematic diagram showing an example of positions where the wafer-detecting sensors are disposed in the inventive polishing apparatus.

Herein, when the turn table 4 is rotating counterclockwise in a direction from $x_1$ to $x_2$ as shown in FIG. 3, for example, the $x_1$ side is referred to as an upstream side of a rotation direction of the turn table 4 with respect to the polishing head 2a, and the $x_2$ side is referred to as a downstream side of a rotation direction of the turn table 4 with respect to the polishing head 2a. Similarly, as to the polishing head 2b, the $x_1$ side comes to be an upstream side, and the $x_2$ side comes to be a downstream side.

As shown in FIG. 3, each wafer-detecting sensor 6 is disposed at the downstream side (the $x_2$ side) of a rotation direction of the turn table 4 with respect to the respective polishing heads 2a and 2b and, in addition, over the peripheral portion of the respective polishing heads.

In this constitution, the wafer detached from the polishing head 2 travels to the rotation direction of the turn table 4 as described above, and accordingly it is possible to detect coming off of the wafer from the polishing head 2 more rapidly. As a result, it is possible to prevent the wafer detached from the polishing head 2 from colliding with another polishing head.

Figure 4:
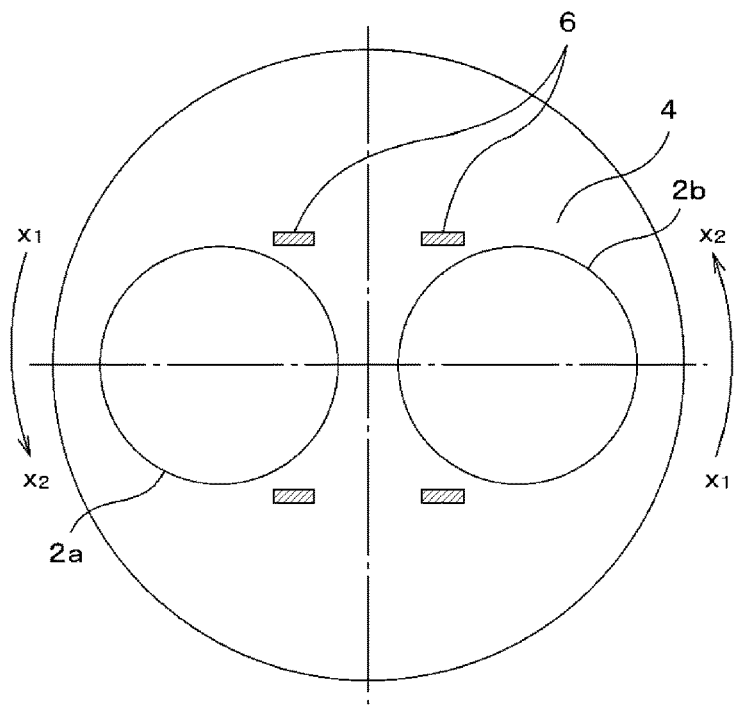
FIG. 4 is a schematic diagram showing another example of positions where the wafer-detecting sensors are disposed in the inventive polishing apparatus.

In addition to the wafer-detecting sensors 6 disposed as shown in FIG. 3, it is preferable that the wafer-detecting sensors 6 be also disposed above peripheral portions of the respective polishing heads 2a and 2b on each upstream side (the $x_1$ side) in a rotation direction of the turn table 4 with respect to the respective polishing heads 2a and 2b as shown in FIG. 4.

This makes it possible to detect coming off of the wafer from the polishing head during polishing more rapidly even when the wafer is polished with the turn table being rotated to the opposite direction (clockwise rotation in a direction from $x_2$ to $x_1$) to the foregoing rotation (counterclockwise rotation in a direction from $x_1$ to $x_2$) without changing the positions of the wafer-detecting sensors 6. As a result, it is possible to prevent the wafer detached from the polishing head from colliding with another polishing head when the turn table 4 is rotated in either direction.

The wafer-detecting sensors 6 are preferably the one which can rapidly output a detection signal, and are preferably the one in which the time for outputting a detection signal from detecting the wafer is 80 μs or less. As the wafer-detecting sensor, a reflection type razor sensor can be used, for example.

Such a sensor can distinguish a wafer and a polishing agent on the polishing pad, and can securely detect whether the wafer is present or not. Moreover, it can rapidly output a detection signal from detecting the wafer, thereby making it possible to prevent the wafer detached from the polishing head from colliding with another polishing head more securely.

It is preferable that the turn table driving mechanism 5 rotate the turn table 4 directly by a motor without using a speed reducer as shown in FIG. 2, and have a function of forcibly stopping a rotation of the motor. As the turn table driving mechanism 5, it is preferable to use a direct drive servo motor, for example.

Such a mechanism can rapidly stop the turn table, thereby making it possible to prevent the wafer detached from the polishing head from colliding with another polishing head more securely. It is also possible to prevent damage of the turn table driving mechanism 5 such as a breakage of the gear, tooth skipping and wearing of the belt in the speed reducer due to forcibly stopping the turn table 4.

Figure 5:
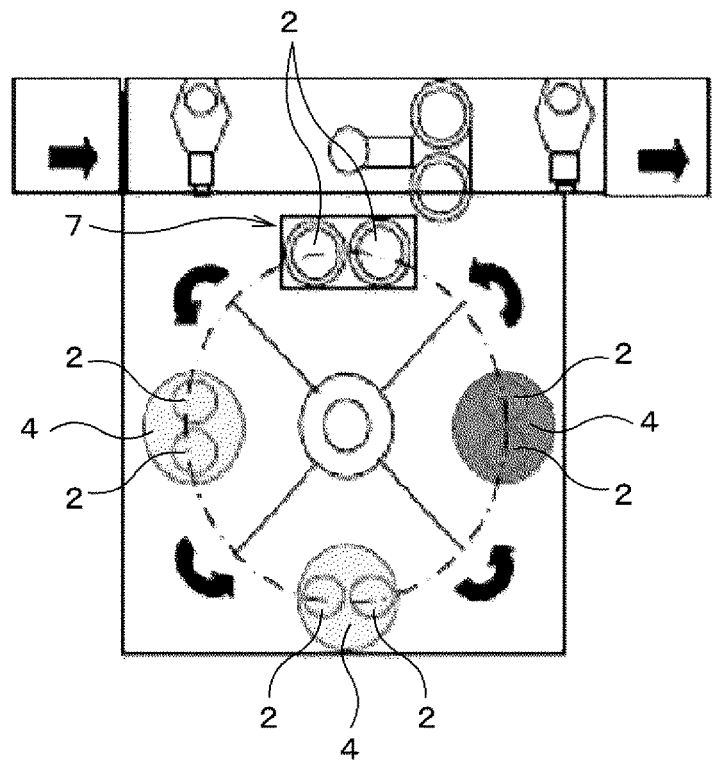
FIG. 5 is a schematic diagram showing an example of an index mode polishing apparatus of the present invention.

The inventive polishing apparatus can also be applied to an index system polishing apparatus provided with three turn tables 4 and a loading-unloading stage 7, in which two polishing heads 2 are allocated to each of the turn tables 4 and the loading-unloading stage 7 as shown in FIG. 5, for example.

EXAMPLE

Hereinafter, the present invention will be specifically described with reference to the inventive Examples and Comparative Examples, but the present invention is not limited thereto.

Example 1

First, a silicon wafer with a diameter of 300 mm was prepared. The wafer was polished by using the inventive polishing apparatus. The polishing apparatus had the wafer-detecting sensors 6 at positions shown in FIG. 4, separated upwardly from the turn table 4 by 150 cm or more in a vertical direction. The wafer-detecting sensor 6 was a reflective raiser sensor (LV-H32 manufactured by KEYENCE CORPORATION), which takes 80 μs to output a detection signal from detecting a wafer. The turn table driving mechanism used was a direct drive servo motor which rotates the turn table 4 directly by a motor without using a speed reducer and has a function of forcibly stopping a rotation of the motor as shown in FIG. 2.

Figure 6:
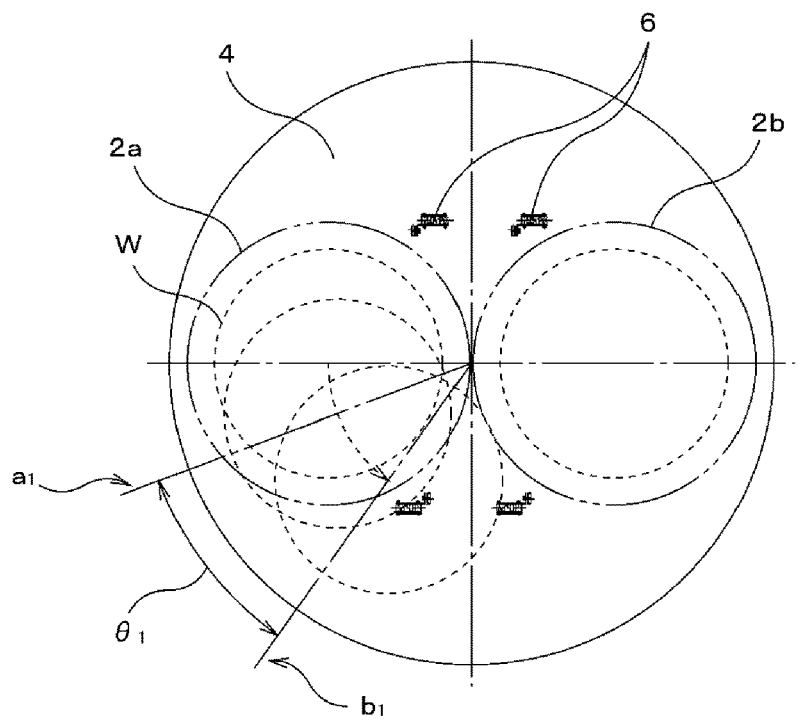
FIG. 6 is a schematic diagram illustrating a travel angle of a wafer from detection of coming off of the wafer until contact of the wafer and a polishing head in Example 1.

An angle $\theta_1$ shown in FIG. 6 was determined, the angle being formed between a line ($a_1$) passing through the center of the wafer W and the center of the turn table 4 when the wafer-detecting sensor 6 detected coming off of the wafer W from the polishing head 2a during polishing and a line ($b_1$) passing through the center of the wafer W and the center of the turn table 4 when the wafer W came into contact with the adjacent polishing head 2b. This angle $\theta_1$ indicates a travel angle of the wafer W traveling toward the rotation direction of the turn table 4, beginning from detection of coming off of the wafer W till it finally came into contact with another polishing head. Larger value of this angle represents rapid detection, and means increased acceptable time for stopping the turn table from the detection.

As the result, the $\theta_1$ was 33.5°. This $\theta_1$ was a larger value compared to $\theta_2$ in Comparative Example 1 described below. That is, in Example 1, the wafer that had come off from the polishing head could be detected more rapidly than in Comparative Example 1.

Comparative Example 1

Figure 7:
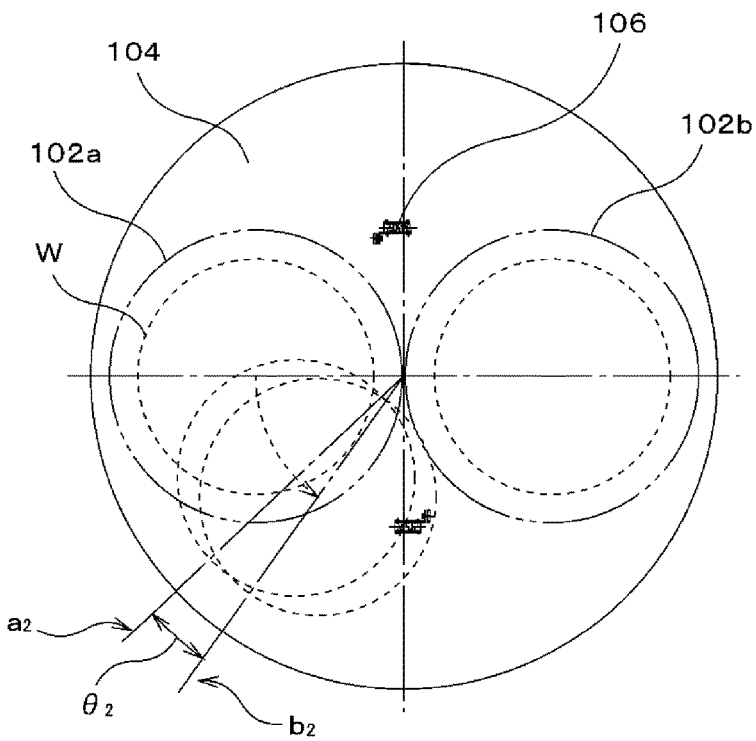
FIG. 7 is a schematic diagram illustrating a travel angle of a wafer from detection of coming off of the wafer until contact of the wafer and a polishing head in Comparative Example 1.
Figure 11:
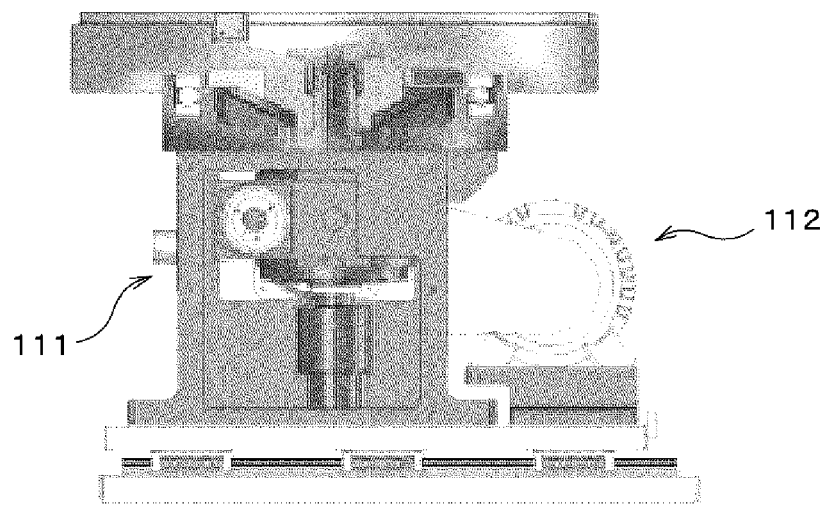
FIG. 11 is a schematic diagram showing a turn table driving mechanism in a previous polishing apparatus.

A wafer was polished by using a previous polishing apparatus provided with wafer-detecting sensors 106 at two points above the turn table 104 in the middle of the adjacent polishing heads 102a and 102b as shown in FIG. 7. The wafer-detecting sensor 106 used was a general optical fiber type which takes 500 μs to output a detection signal from detecting a wafer. The turn table driving mechanism used was composed of a warm speed reducer 111 and a constant torque motor 112 for inverter driving as shown in FIG. 11.

An angle $\theta_2$ was determined during polishing of a wafer W having a diameter of 300 mm in the same manner with Example 1 except for using a previous polishing apparatus described above, the angle being formed between a line ($a_2$) passing through the center of the wafer W and the center of the turn table 104 when detecting coming off of the wafer W from the polishing head 102a and a line ($b_2$) passing through the center of the wafer W and the center of the turn table 104 when the wafer W came into contact with the adjacent polishing head 102b.

As the result, $\theta_2$ was 11.0°.

Example 2

Wafers each having a diameter of 300 mm were polished by using the inventive polishing apparatus similar to that in Example 1. The rotation rate of the turn table 4 was altered from 10 rpm to 40 rpm when polishing to determine times taken for stopping the turn table actually (times for stopping the turn table) and rotated angles of the turn table until stopping the turn table actually (travel angles of the turn table) beginning from detecting coming off of a wafer from the polishing head with the wafer-detecting sensors during polishing. These results are shown in Table 1 for each rotation rate of the turn table 4 that had been altered together with the existence or nonexistence of a collision (a crash) between the wafer and the polishing head at each case. Incidentally, Table 1 also represents the measured results of Comparative Example 2 described below.

TABLE 1

|  | Comparative Example 2 | | | Example 2 | | |
| --- | --- | --- | --- | --- | --- | --- |
| Rotation rate of turn table (rpm) | Travel angle of turn table (°) | Time for stopping turn table (ms) | Crash | Travel angle of turn table (°) | Time for stopping turn table (ms) | Crash |
| 10 | 9 | 150 | None | 3.6 | 60 | None |
| 20 | 30 | 250 | Exit | 7.2 | 60 | None |
| 30 | 63 | 350 | Exit | 10.8 | 60 | None |
| 40 | 108 | 450 | Exit | 14.4 | 60 | None |

In Example 2, the times for stopping the turn table were always 60 ms independent of the rotation rate of the turn table as shown in Table 1 since a direct drive servo motor was used as the turn table driving mechanism. The travel angle of the turn table became larger as the rotation rate of the turn table was increased, and was 14.4° when the rotation rate of the turn table was 40 rpm. This angle was a smaller value compared to the $\theta_1$ determined in Example 1 (33.5°) even when the rotation rate of the turn table was 40 rpm, and accordingly there was no crash due to coming off of the wafer.

On the other hand, Comparative Example 2 generated crashes when the rotation rate of the turn table was 20 rpm or more as will be described below.

Comparative Example 2

Wafers each having a diameter of 300 mm were polished in the same manner with Example 2 except for using a prior polishing apparatus similar to that in Comparative Example 1 to measure the times for stopping the turn table and the travel angles of the turn table, beginning from detection of coming off of the wafer from the polishing heads with the wafer-detecting sensor. These results are shown in Table 1 together with existence or nonexistence of a crash of the wafer at that time.

When the rotation rate of the turn table was 10 rpm, the travel angle of the turn table was 9°, which was a smaller value compared to the $\theta_2$ determined in Comparative Example (=11.0°), and accordingly there was no crash due to coming off of the wafer as shown in Table 1. When the rotation rate of the turn table became higher, the time for stopping the turn table became longer, which made the travel angle of the turn table larger. When the rotation rate of the turn table was 20 rpm or more, the travel angle of the turn table were 30° or more, which were larger values compared to the $\theta_2$, thereby generating crashes.

Example 3

Wafers each having a diameter of 300 mm were polished by using an index system polishing apparatus (SRED manufactured by FUJIKOSHI MACHINERY CORP.) provided with three turn tables 4 and a loading-unloading stage 7, in which two polishing heads 2 were allocated to each of the turn tables 4 and the loading-unloading stage 7 as shown in FIG. 5. The three turn tables 4 were provided with polishing pads of suede and nonwoven fabric. Incidentally, the sensor for detecting a wafer and the turn table driving mechanism used had the same constitutions with those used in Example 1.

Figure 8:
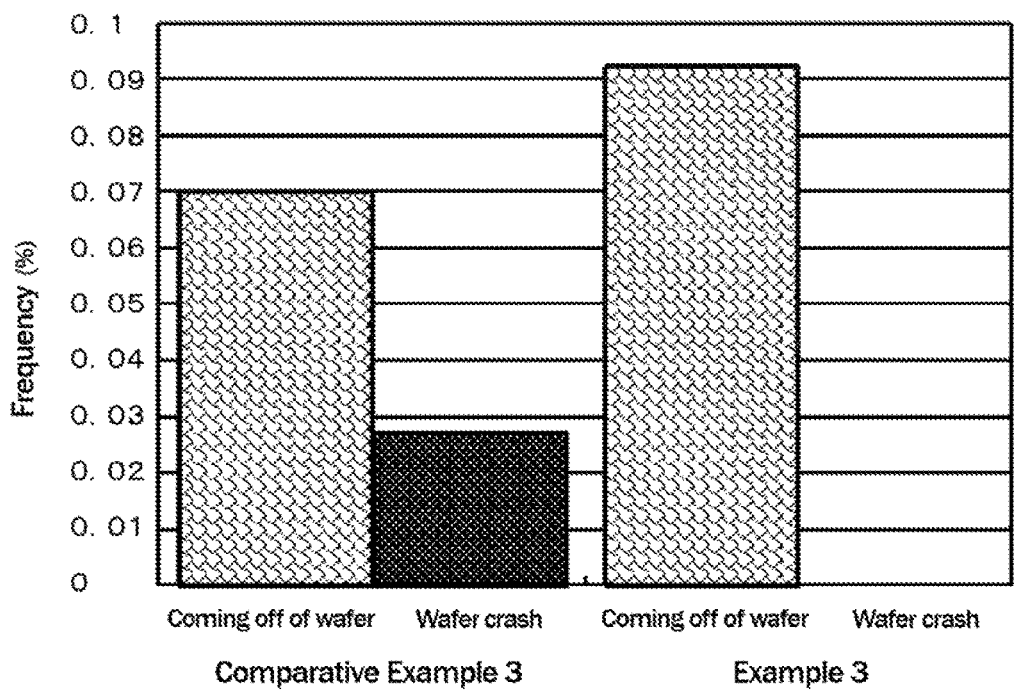
FIG. 8 is a graph showing frequencies of coming off of wafers and wafer crash in Example 3 and Comparative Example 3.
Figure 9:
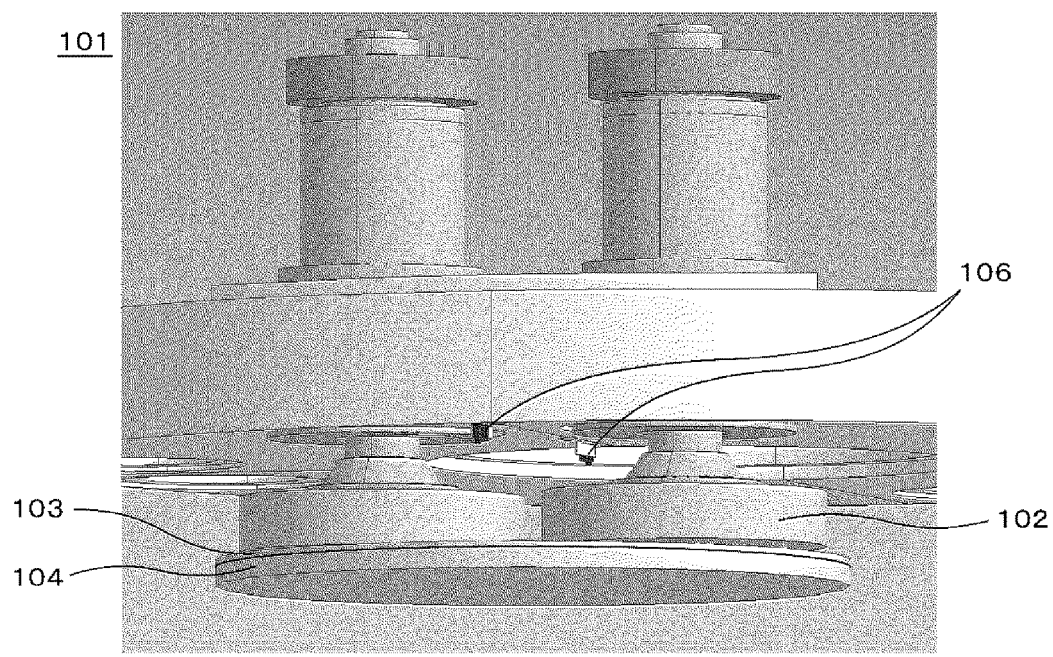
FIG. 9 is a schematic diagram showing a previous polishing apparatus.
Figure 10:
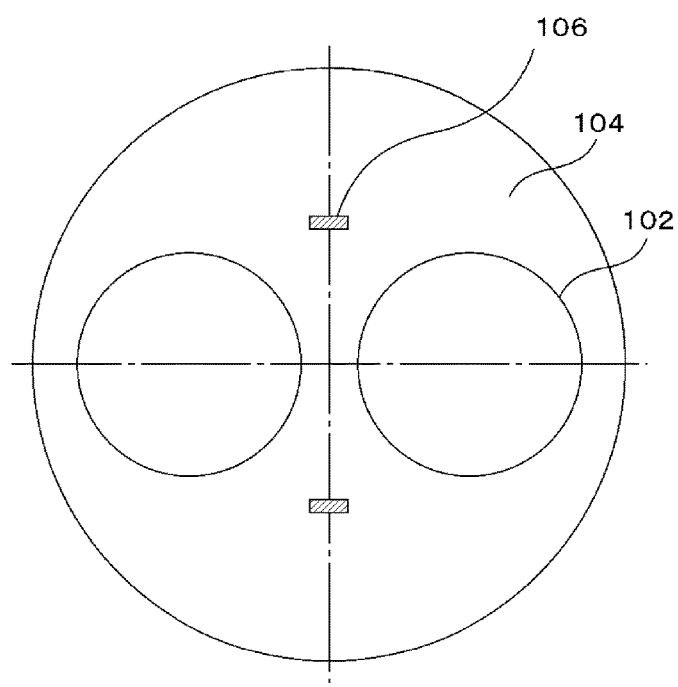
FIG. 10 is a schematic diagram showing positions where the wafer-detecting sensors are disposed in a previous polishing apparatus.

The wafers were polished by rotating the turn table 4 and the polishing heads 2 in the same rotational direction under the load of 120 g/cm$^2$, with the rotation rates of the turn table and the polishing head were altered in stages to 6.6 to 29.0 rpm and 6.6 to 31 rpm respectively. The frequency of coming off of the wafer from the polishing heads 2 during polishing was measured. Moreover, the frequency of wafer crash due to coming off of the wafer was measured, which are shown in FIG. 8 and Table 2.

TABLE 2

|  | Comparative Example 3 | Example 3 |
| --- | --- | --- |
| Frequency of coming off of wafer (%) | 0.070 | 0.092 |
| Frequency of wafer crash (%) | 0.027 | 0 |

The frequency of coming off of the wafer from the polishing heads 2 during polishing was 0.092%, which was an equal level to Comparative Example 3 described below. While the frequency to generate wafer crash was 0%, that is, wafer crash did not occur in Example 3. On the other hand, wafer crash occurred in Comparative Example 3. As a result, Example 3 showed higher productivity of wafers compared to Comparative Example 3 since wafer crash could be prevented.

Comparative Example 3

Wafers each having a diameter of 300 mm were polished in the same manner with Example 3 except for using an index mode polishing apparatus composed of wafer-detecting sensors and a turn table driving mechanism as that of Comparative Example 1 to measure the frequency of coming off of the wafer and the frequency of wafer crash. These results are shown in FIG. 8 and Table 2.

The frequency of coming off of the wafer from the polishing heads during polishing was 0.070%, and the frequency to generate wafer crash was 0.027%. As described above, in Comparative Example 3, wafer crash occurs, and breakage of a wafer was generated, which make the polishing apparatus be stopped for a long time to exchange the polishing pads and the polishing heads. Accordingly, the productivity was substantially lower compared to Example 3.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polishing apparatus comprising:
   a plurality of polishing heads for holding a wafer,
   a polishing pad for polishing the wafer,
   a rotatable turn table having the polishing pad attached thereto,
   a turn table driving mechanism for rotating the turn table,
   a plurality of wafer-detecting sensors for detecting coming off of the wafer from the polishing head during polishing,
   wherein the polishing apparatus has wafer-detecting sensors of the plurality of wafer-detecting sensors disposed above peripheral portions of the respective polishing heads, on a downstream side in a rotation direction of the turn table with respect to the respective polishing heads, and positioned to detect the wafer coming off from the respective polishing heads,
   the polishing apparatus also has wafer-detecting sensors of the plurality of wafer-detecting sensors disposed above peripheral portions of the respective polishing heads, on an upstream side in a rotation direction of the turn table with respect to the respective polishing heads, and positioned to detect the wafer coming off from the respective polishing heads,
   the turn table driving mechanism is a motor which rotates the turn table directly by the motor without using a speed reducer and has a function of forcibly stopping a rotation of the motor, wherein said motor is a direct drive servo motor, and
   in response to one of the plurality of wafer-detecting sensors detecting the wafer coming off from the respective polishing heads during polishing, the one of the plurality of wafer-detecting sensors outputs a detection signal to the turn table driving mechanism to stop a rotation of the turn table.

2. The polishing apparatus according to claim 1, wherein each of the plurality of wafer-detecting sensors takes 80 μs or less to output a detection signal from detecting the wafer.

* * * * *